United States Patent
Schaffer et al.

(10) Patent No.: US 9,250,417 B2
(45) Date of Patent: Feb. 2, 2016

(54) OPTICAL ARRANGEMENT IN A MICROLITHOGRAPHIC PROJECTION EXPOSURE APPARATUS

(75) Inventors: Dirk Schaffer, Jena (DE); Stefan Hembacher, Bobingen (DE); Jens Kugler, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 874 days.

(21) Appl. No.: 13/467,760

(22) Filed: May 9, 2012

(65) Prior Publication Data
US 2012/0300183 A1 Nov. 29, 2012

Related U.S. Application Data

(60) Provisional application No. 61/490,113, filed on May 26, 2011.

(30) Foreign Application Priority Data

May 26, 2011 (DE) .......................... 10 2011 076 549

(51) Int. Cl.
*G03B 27/54* (2006.01)
*G02B 7/182* (2006.01)
*G03F 7/20* (2006.01)

(52) U.S. Cl.
CPC .............. *G02B 7/182* (2013.01); *G02B 7/1827* (2013.01); *G03F 7/70316* (2013.01)

(58) Field of Classification Search
CPC ... G03F 7/70316; G02B 7/182; G02B 7/1827

USPC ............................................. 355/66; 359/866
See application file for complete search history.

(56) References Cited

U.S. PATENT DOCUMENTS

| 5,674,414 A | 10/1997 | Schweizer |
| 6,876,484 B2 * | 4/2005 | Greywall .............. G02B 26/06 359/224.1 |
| 7,538,856 B2 | 5/2009 | Kajiyama et al. |

(Continued)

FOREIGN PATENT DOCUMENTS

| DE | 195 34 165 B4 | 5/1996 |
| DE | 102 05 425 A1 | 5/2003 |

(Continued)

OTHER PUBLICATIONS

German Office Action, with English translation, for corresponding DE Application No. 10 2011 076 549.2, dated Jan. 12, 2012.

*Primary Examiner* — Deoram Persaud
(74) *Attorney, Agent, or Firm* — Fish & Richardson P.C.

(57) ABSTRACT

The disclosure relates to optical arrangements in a microlithographic projection exposure apparatus. In accordance with one aspect, an optical arrangement has at least one mirror segment arrangement including a plurality of separate mirror segments. The mirror segments are connected to a carrying structure of the projection exposure apparatus via mounting elements. At least one of the mounting elements, which is assigned to a first one of the mirror segments, extends, on the opposite side to the optically active surface of the mirror segment arrangement, at least partly into the region of a second mirror segment of the mirror segment arrangement. The second mirror segment is adjacent to the first mirror segment.

23 Claims, 7 Drawing Sheets

(56) References Cited

U.S. PATENT DOCUMENTS

| | | |
|---|---|---|
| 2005/0030656 A1 | 2/2005 | Holderer et al. |
| 2005/0174650 A1 | 8/2005 | Melzer et al. |
| 2008/0298060 A1* | 12/2008 | Ohkawa ................. 362/240 |
| 2011/0063836 A1 | 3/2011 | Salm |
| 2012/0044473 A1* | 2/2012 | Lippert ................. G02B 1/10 355/66 |
| 2014/0176927 A1* | 6/2014 | Kwan ................. G03F 7/70825 355/67 |
| 2015/0055112 A1* | 2/2015 | Schaffer ................. G03F 7/702 355/67 |

FOREIGN PATENT DOCUMENTS

| | | | |
|---|---|---|---|
| DE | 102 19 514 A1 | 11/2003 | |
| DE | 10 2010 043 498 | 5/2012 | |
| DE | WO 2014180931 A1 * | 11/2014 | ......... G03F 7/70825 |
| EP | 2 309 296 A1 | 4/2011 | |
| WO | WO 2012/059537 | 5/2012 | |

* cited by examiner

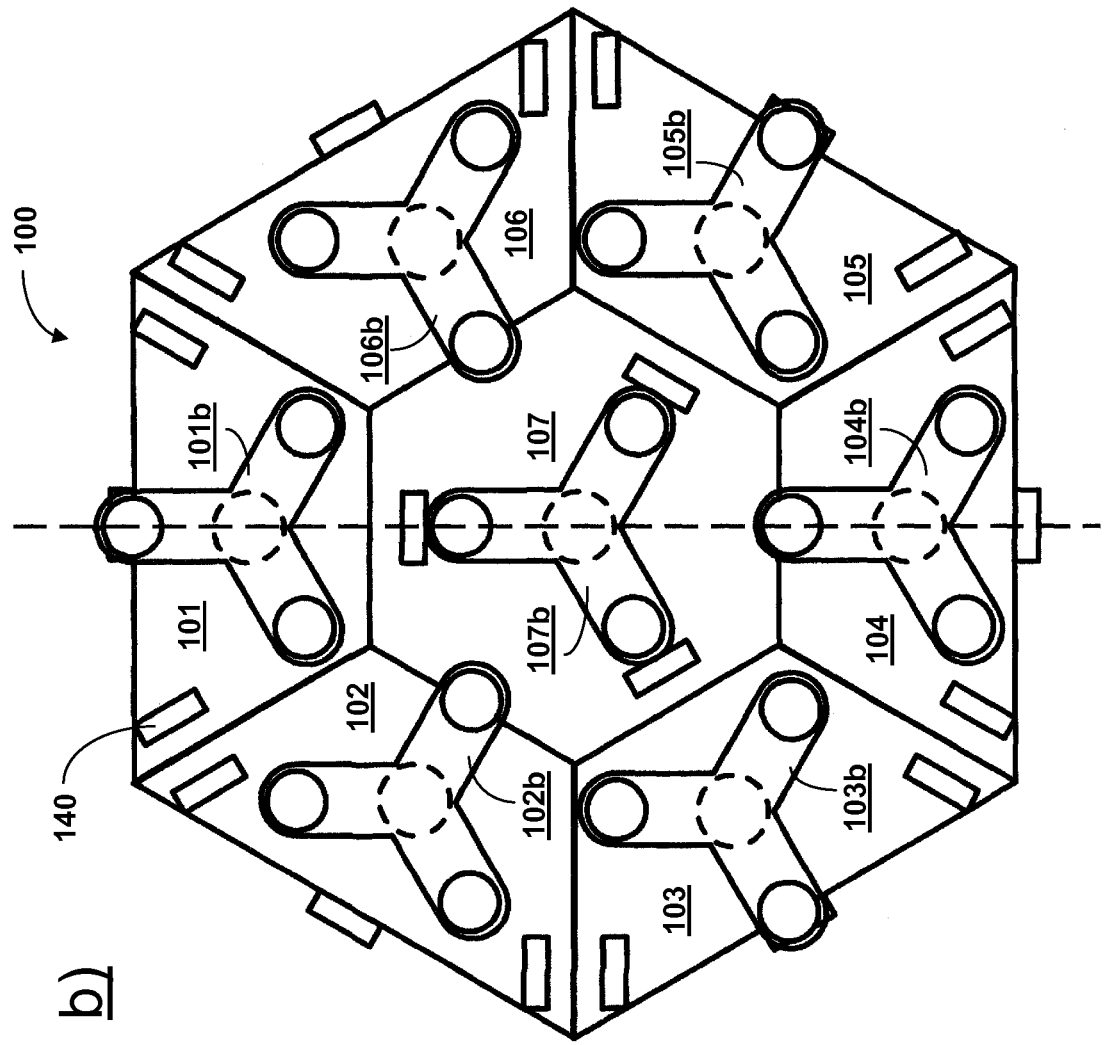
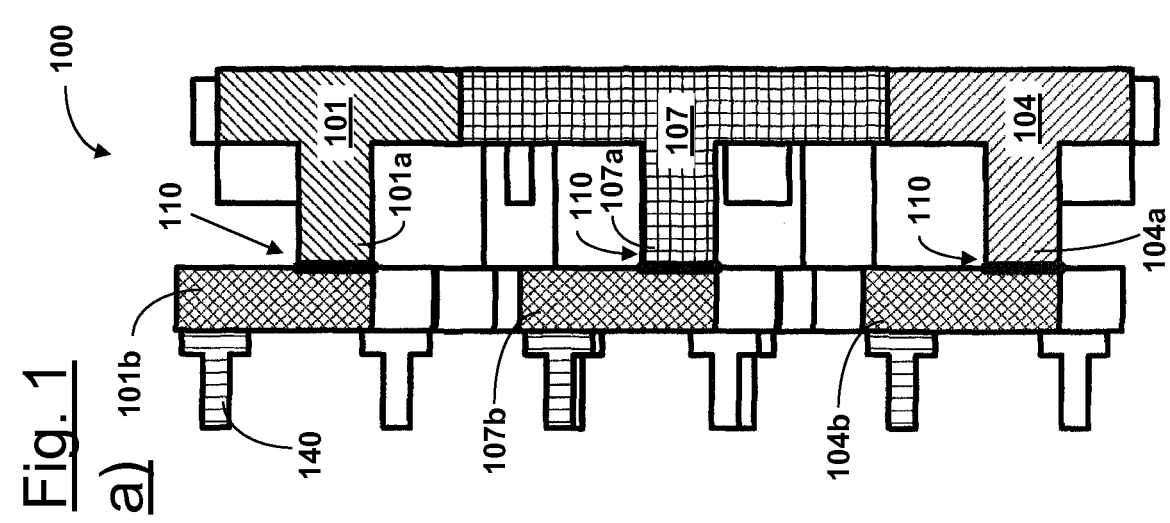
Fig. 1

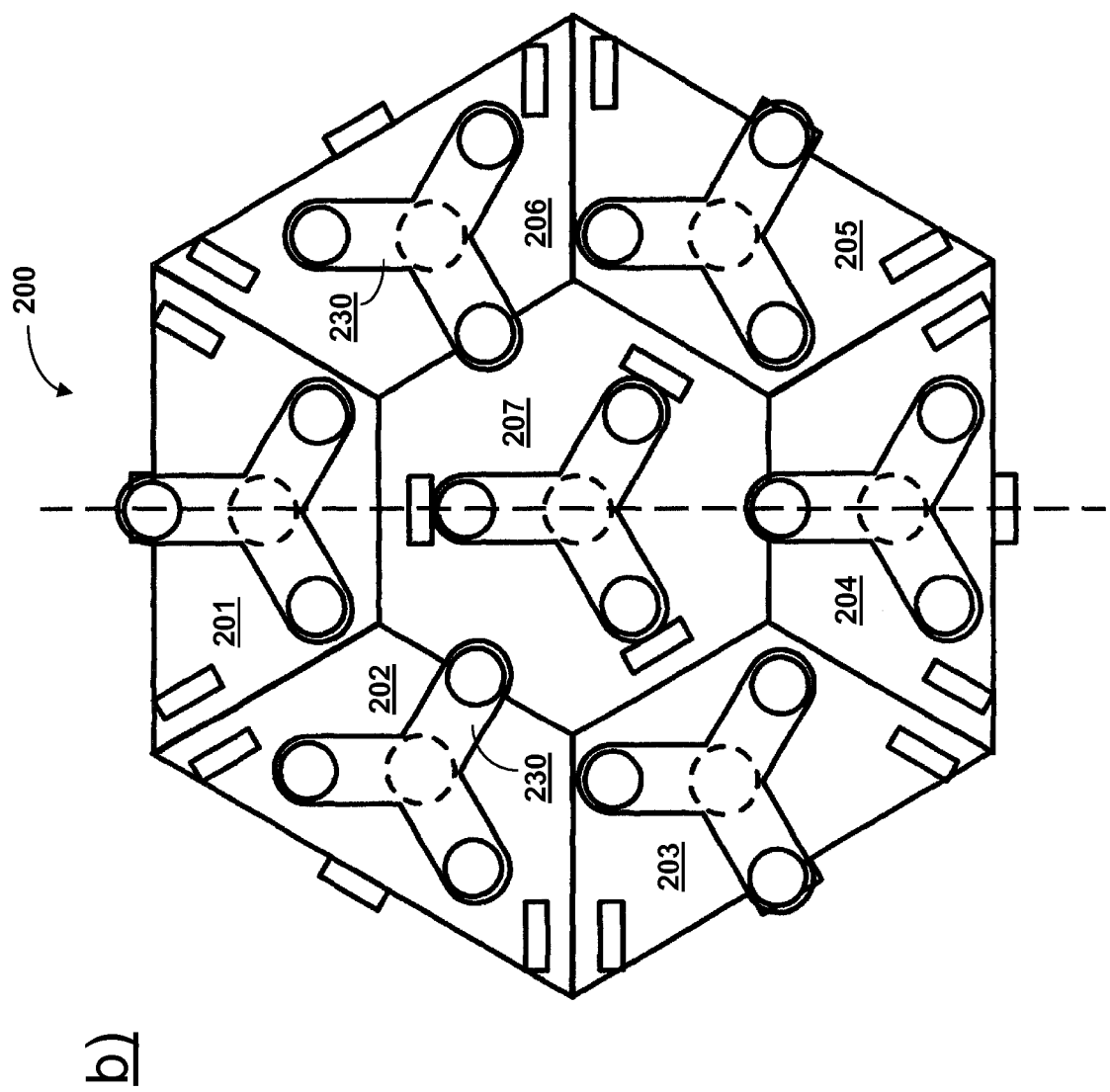
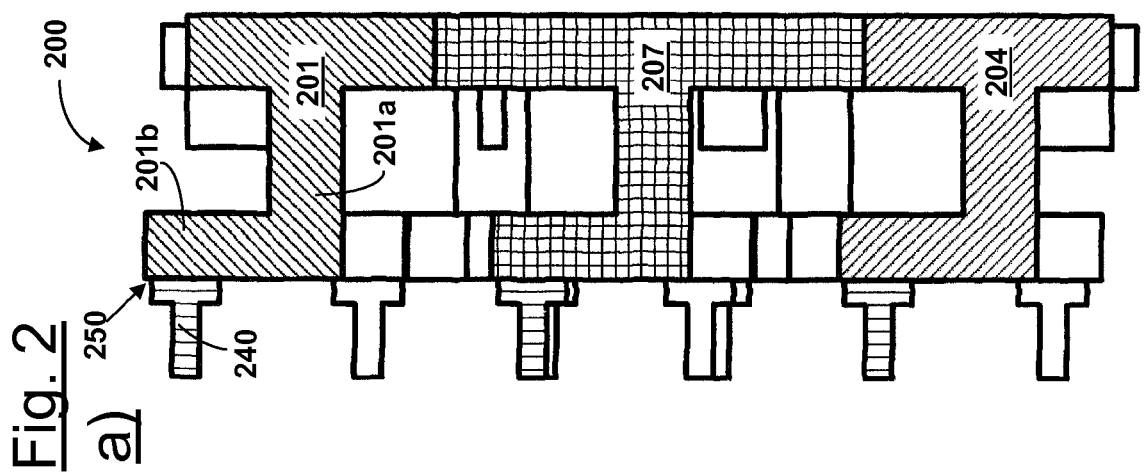
Fig. 2

Fig. 3
a)
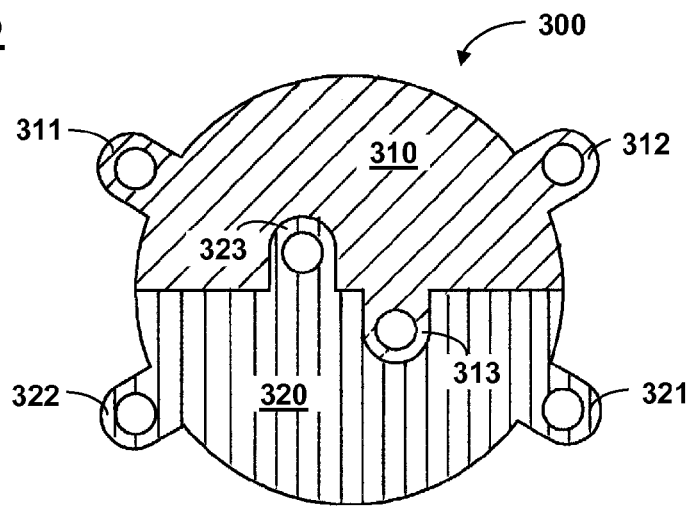
b)
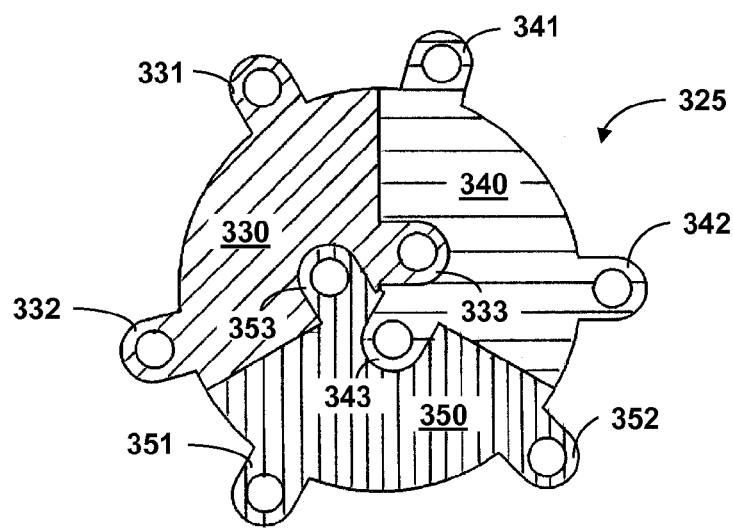
c)
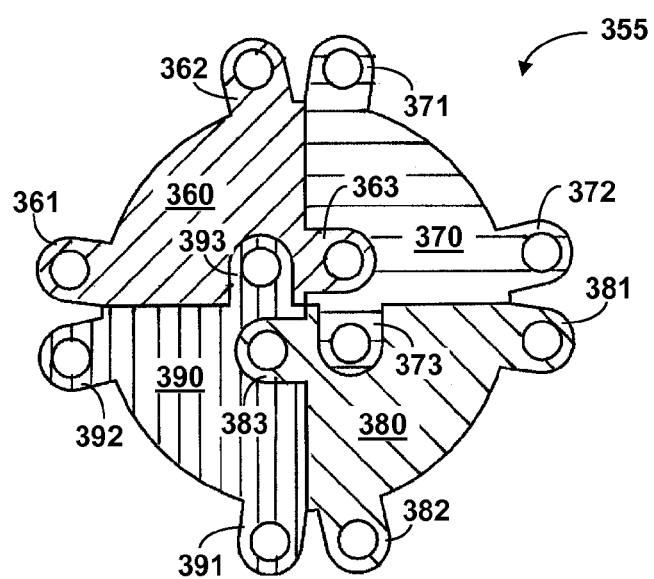

Fig. 4
a)
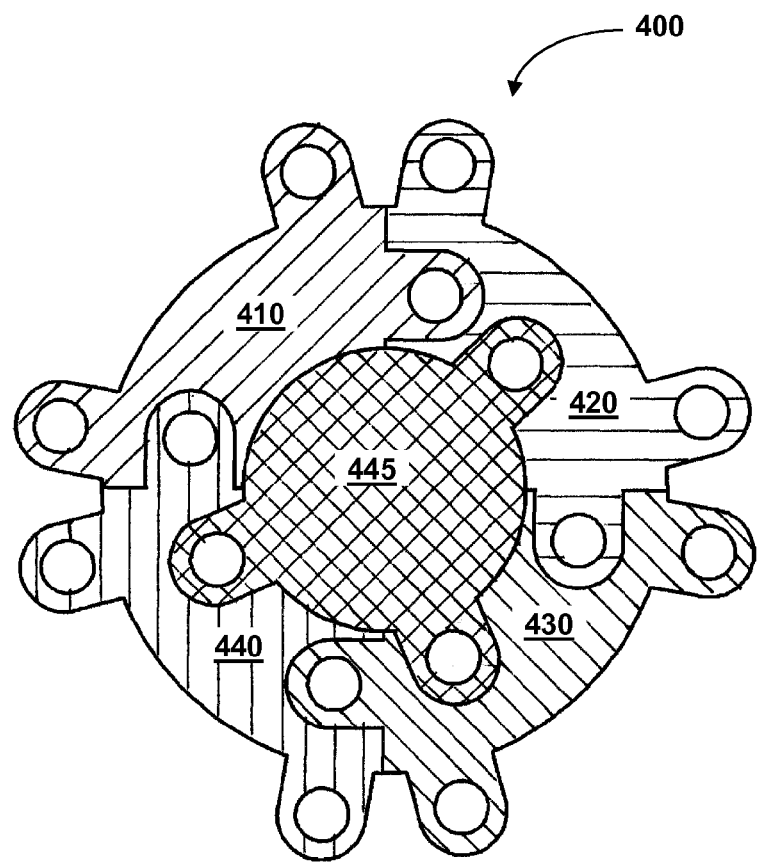
b)
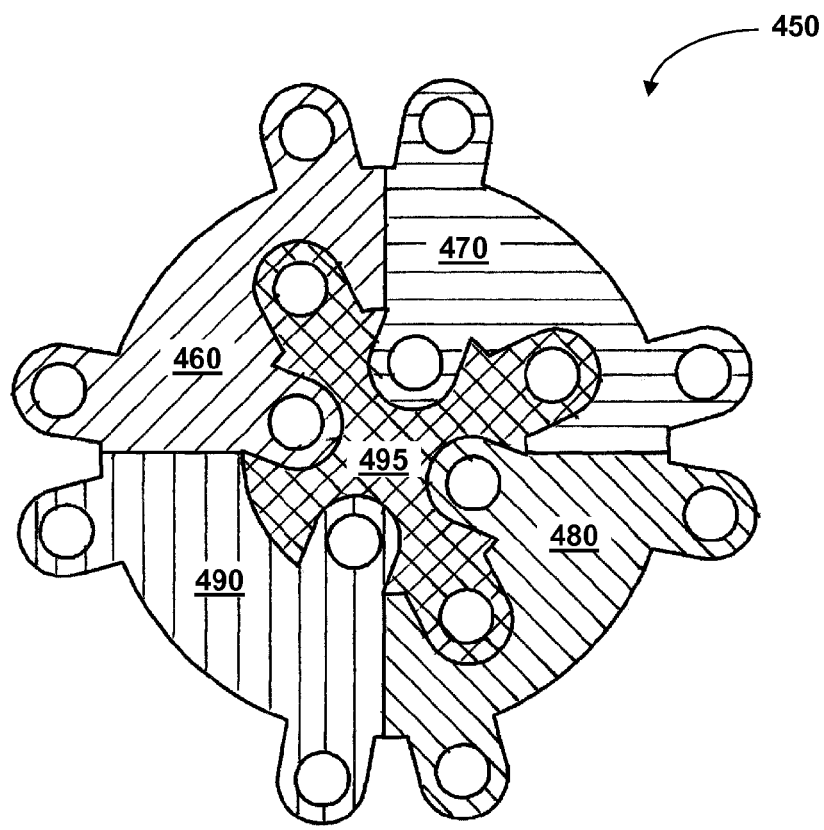

Fig. 5
a)
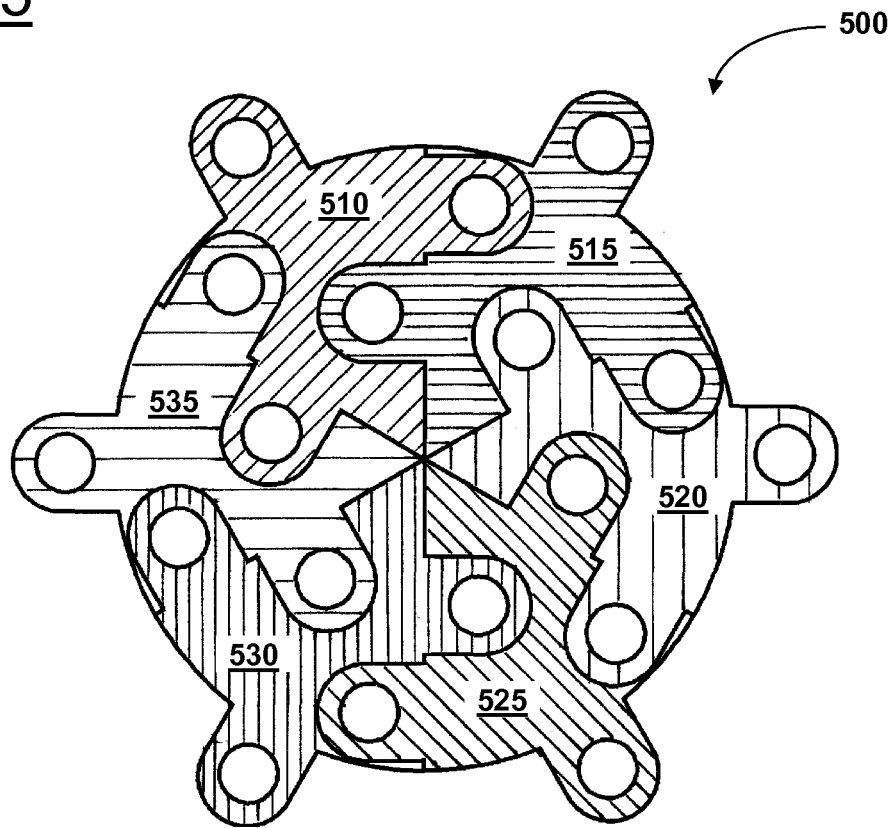
b)
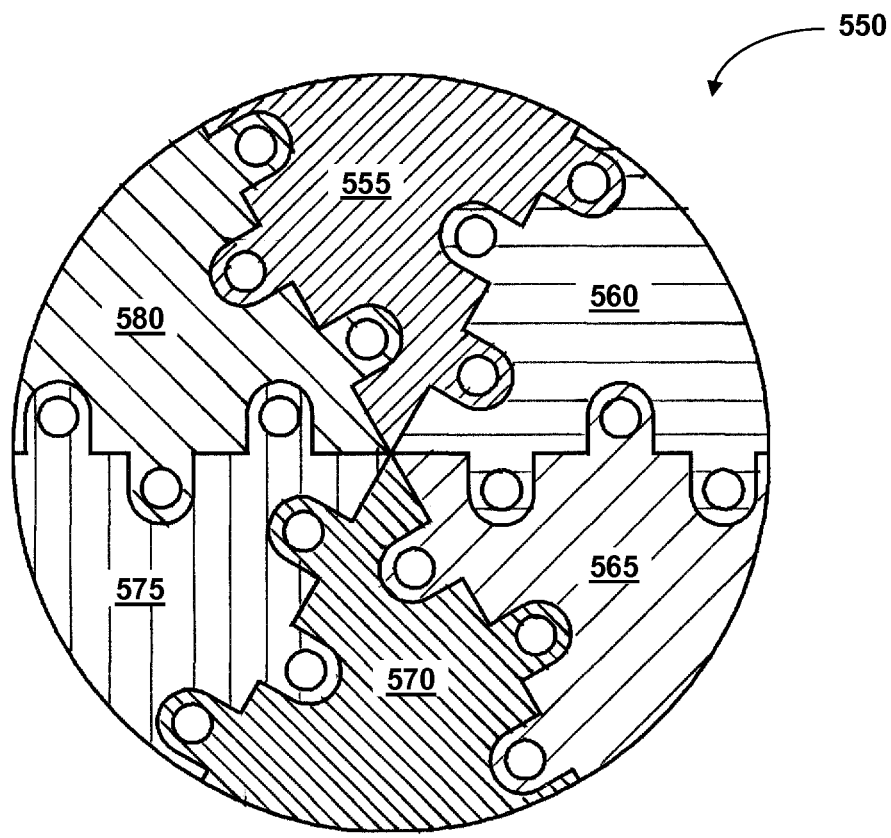

OPTICAL ARRANGEMENT IN A MICROLITHOGRAPHIC PROJECTION EXPOSURE APPARATUS

CROSS-REFERENCE TO RELATED APPLICATIONS

This application claims priority under 35 U.S.C. §119(e)(1) to U.S. Provisional Application No. 61/490,113 filed May 26, 2011. This application also benefit under 35 U.S.C. §119 to German Application No. 10 2011 076 549.2, filed May 26, 2011. The contents of both of these applications are hereby incorporated by reference in its entirety.

FIELD

The disclosure relates to an optical arrangement in a microlithographic projection exposure apparatus.

BACKGROUND

Microlithography is used for producing microstructured components such as, for example, integrated circuits or LCDs. The microlithography process is carried out in a so-called projection exposure apparatus having an illumination device and a projection lens. The image of a mask (=reticle) illuminated by the illumination device is in this case projected by the projection lens onto a substrate (e.g. a silicon wafer) coated with a light-sensitive layer (photoresist), and arranged in the image plane of the projection lens, in order to transfer the mask structure to the light-sensitive coating of the substrate.

In projection lenses designed for the EUV range, i.e. at wavelengths of e.g. approximately 13 nm or approximately 7 nm, mirrors are often used as optical components for the imaging process due to the general unavailability of suitable light-transmissive refractive materials.

Typical projection lenses designed for EUV, as known e.g. from U.S. Pat. No. 7,538,856 B2, can have, for example, an image-side numerical aperture (NA) in the range of NA=0.2 to 0.3 and image an (e.g. ring-shaped) object field into the image plane or wafer plane.

As the image-side numerical aperture (NA) continues to increase, an accompanying enlargement of the mirror surfaces can entail an increasing technological production outlay and cost expenditure. In general, with increasing dimensions of the mirrors, larger processing machines are used for production, and more stringent desired properties are usually involved for the processing tools used (such as e.g. grinding, lapping, and polishing machines, interferometers, cleaning and coating apparatuses). Furthermore, the production of larger mirrors typically involves the use of heavier mirror base bodies which, above a certain limit, can scarcely be mounted any more or flex beyond an acceptable amount owing to gravitation.

Further, both in the case of passive mounting and in the case of active mounting (i.e. in a manner that makes actuation possible) of a mirror, it is generally inherently undesirable to install mounting elements in regions outside the mirror base body or the active surface thereof, because such installation can contribute to an enlargement of the structural space, which is limited anyway. On the other hand, however, it is also generally disadvantageous to install the relevant mounting elements directly on the rear side of the mirror, i.e. on that side thereof which faces away from the optically active surface, in view of the deformation inputs which can be significantly increased in the case of such a geometry. Such deformation inputs typically proceed from joints which are at the transition from the mirror material to the (e.g. metallic) materials used for mounting or actuation and, via the local stresses associated with the corresponding joining process (e.g. soldering or adhesive bonding), cause the introduction of mechanical stresses or deformations into the material of the mirror or mirror segment. Because these joints are not completely stable over time on account of relaxation effects that occur, the deformation influence of the joint additionally varies over the lifetime of the mirror, such that it also cannot readily be eliminated by single post-processing of the mirror for instance directly after production.

SUMMARY

The disclosure provides an optical arrangement in a microlithographic projection exposure apparatus which makes it possible to realize higher numerical apertures while at least largely avoiding certain production engineering problems.

In accordance with one aspect, the disclosure relates to an optical arrangement in a microlithographic projection exposure apparatus, including
- at least one mirror segment arrangement including a plurality of separate mirror segments;
- wherein the mirror segments are connected to a carrying structure of the projection exposure apparatus via mounting elements; and
- wherein at least one of the mounting elements, which is assigned to a first one of the mirror segments, extends, on the opposite side to the optically active surface of the mirror segment arrangement, at least partly into the region of a second mirror segment of the mirror segment arrangement, the second mirror segment being arranged adjacent to the first mirror segment.

Compared to a mirror not embodied in segmented fashion, a mirror segment arrangement having separate mirror segments can have significant production engineering advantages. First, the maximum diameter to be processed can be, in the case of the mirror segment arrangement according to the disclosure, significantly smaller (merely by way of example of the order of magnitude of 70% or less) than the maximum diameter of a corresponding unsegmented mirror. Consequently, under certain circumstances, production is actually made possible technologically in the first place, or it is possible to avoid additional capital investments in new and larger production machines. Second, because the individual mirror segments can be thinner, the components to be handled can have a significantly lower (total) mass, merely by way of example of the order of magnitude of 25% or less, in comparison with a corresponding unsegmented mirror. On account of the reduction of the total mass and in accordance with the number of segments of additional supporting points present without constraint, it is also possible to reduce the gravitation-dictated deformation of the mirror segments or arrangement on account of the inherent weight.

In accordance with this approach, at least one mounting element, on the opposite side to the optically active surface of the mirror segment arrangement, can extend into the region of an adjacent mirror segment, by a "protrusion" of the relevant mounting element beyond the mirror base body or beyond the optically active surface of the mirror segment arrangement and an associated enlargement of the structural space is avoided. Moreover, the enlargement of deformation effects that is associated with directly installing the mounting element on the rear side of the associated mirror segment is prevented because the availability of the structural space provided by adjacent mirror segments is used for the geometrical arrangement of the mounting element.

In other words, in accordance with the abovementioned aspect, the disclosure is based on the concept of realizing the linking of at least one mirror segment of the mirror segment arrangement for mounting and/or actuation admittedly in respect of deformation aspects outside the base area of the respective mirror segment, but at the same time keeping available the space for this linking (as it were as an "undercut") in an adjacent mirror segment and thus accommodating the linking, in a favorable manner in respect of structural space aspects, still within the base area of the entire mirror segment arrangement or the optically active surface thereof.

Because the relevant mounting element is configured without mechanical contact with the adjacent mirror segment, installing the mounting element on the rear side of the mirror segment adjacent to the actually associated mirror segment has no disadvantageous effects with regard to the introduction of deformation effects, because the relevant mounting element is indeed not directly mechanically linked on the rear side of the associated linked mirror segment.

As a result, what is achieved according to the disclosure is that in the mirror segment arrangement the linking of at least one mounting element below the optically active surface of the mirror segment arrangement can be realized by the respective mechanical linking being attached in each case below an adjacent mirror segment, wherein the structural space can already be kept available, in particular, in the adjacent mirror segment. Furthermore, decoupling regions or elements, as will be described below, can be dispensed with, such that an impairment of the stiffness of the arrangement by the linking can also be avoided.

In accordance with one embodiment, the mounting element is arranged completely outside the region covered by the first mirror segment. Even though this configuration is preferred with regard to the minimization of deformation inputs in conjunction with achievable stiffness of the arrangement, the disclosure is not restricted thereto. Thus, in principle, the disclosure should be deemed also to encompass those configurations in which at least one mounting element extends at least partly into the region below another mirror segment (different from that to which the mounting element is assigned or to which it is mechanically linked) but—for instance on account of a bent-over section or the like—is also partly still situated below the assigned or mechanically linked mirror segment.

In accordance with one embodiment, the relevant second mirror segment, arranged adjacent to the first mirror segment, for the relevant mounting element can have a cutout, that is to say a region in which mirror material is "omitted". However, the disclosure is not restricted thereto, but rather, in principle, also encompasses any arrangements in which the relevant mounting element extends into the region of the mirror segment adjacent to the associated mirror segment, wherein this extending can also be present in the form of an arrangement below the relevant adjacent mirror segment (without the latter having to have a cutout for this purpose).

In accordance with one embodiment, exactly three mounting elements are assigned to each mirror segment, as a result of which a statically uniquely determined mounting is obtained.

The mirror segment can be actuable, in particular, along the at least one mounting element.

In accordance with further embodiments, for at least two mirror segments, more particularly for at least three mirror segments, and more particularly for all of the mirror segments of the mirror segment arrangement, in each case at least one mounting element assigned to the respective mirror segment extends, on the opposite side to the optically active surface of the mirror segment arrangement, at least partly into the region of another mirror segment of the mirror segment arrangement.

In further embodiments, at least two, more particularly at least three, mounting elements which are assigned to the same mirror segment can also extend, on the opposite side to the optically active surface of the mirror segment arrangement, at least partly into the region of a respective mirror segment of the mirror segment arrangement adjacent to the first mirror segment.

In accordance with a further aspect, the disclosure relates to an optical arrangement in a microlithographic projection exposure apparatus, including at least one mirror segment arrangement including a plurality of separate mirror segments;

wherein the mirror segments are connected to a carrying structure of the projection exposure apparatus via mounting elements; and wherein at least one of the mirror segments has, on the opposite side to the optically active surface of the mirror segment arrangement, a tapering adjoined by a widened section for the mounting and/or actuation of the mirror segment.

This aspect of the disclosure avoids a structural space enlargement associated with an arrangement of mounting elements outside the optically active surface of the mirror segment arrangement, and an additional deformation input associated with the arrangement of the relevant mounting element within the region defined by the optically active surface of the mirror segment arrangement is at least reduced.

On account of the tapering—provided according to the disclosure—adjoined by the widened section for mounting and/or actuation, it is possible, specifically, to obtain a mechanical decoupling of the mechanical stresses or deformation effects proceeding from the relevant joint and at the same time, on account of the widened section, to ensure that the relevant mirror segment can be mounted and/or actuated sufficiently precisely (on account of the enlarged "lever" obtained by the widening).

In accordance with one embodiment, the widened section forms a tripod.

Furthermore, the tapering can be embodied in the form of a web. The web can have, in particular, a length corresponding at least to the maximum diameter of the web, in particular to at least 1.2 times the maximum diameter, and more particularly to 1.4 times the maximum diameter of the web.

In accordance with one embodiment, the mirror segment arrangement has at least three mirror segments, in particular at least four mirror segments.

The mirror segments which are adjacent in the mirror segment arrangement according to the disclosure can generally be joined together optically seamlessly or else be at a finite distance from one another, which either can be governed by the production process or else can be provided in a targeted manner for the purpose of aligning the mirror segment arrangement.

The disclosure furthermore relates to a microlithographic projection exposure apparatus for EUV lithography, including an illumination device and a projection lens, wherein illumination device and/or projection lens have/has an optical arrangement disclosed herein.

Further configurations of the disclosure can be gathered from the description and the dependent claims.

BRIEF DESCRIPTION OF THE DRAWINGS

The disclosure is explained in greater detail below on the basis of exemplary embodiments illustrated in the accompanying figures, in which:

FIGS. 1-2 show schematic illustrations for elucidating different embodiments in accordance with a first aspect of the disclosure;

FIGS. 3-6 show schematic illustrations for elucidating different embodiments in accordance with a second aspect of the disclosure.

DETAILED DESCRIPTION OF THE PREFERRED EMBODIMENTS

Figure 6:
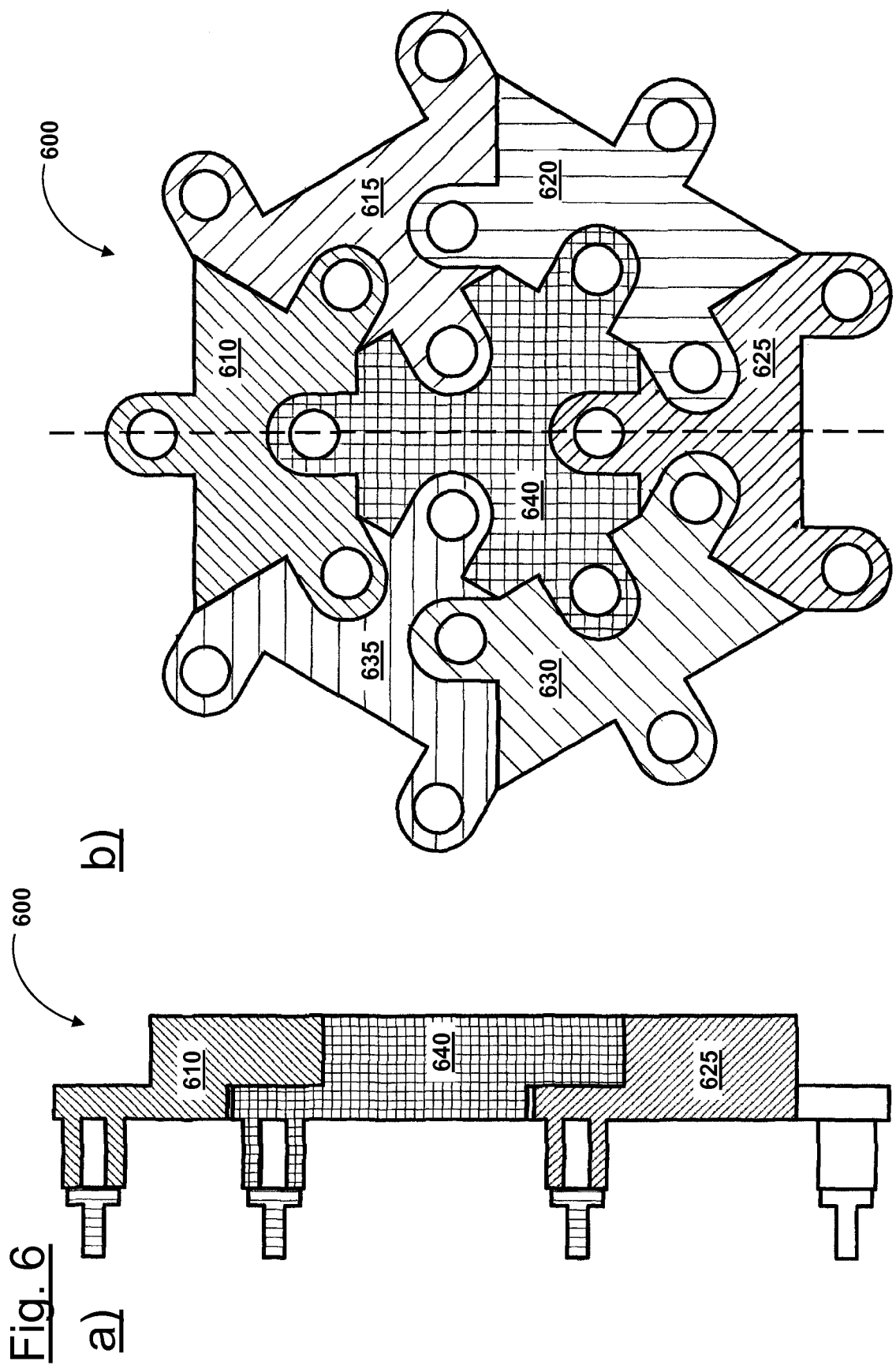

Embodiments in accordance with a first aspect of the disclosure are explained below with reference to FIGS. 1a-b and FIGS. 2a-b.

FIGS. 1a-b firstly show, in a merely schematic illustration, an optical arrangement in plan view (FIG. 1b) and in side sectional view (FIG. 1a) in accordance with a first embodiment of the disclosure.

As can best be seen from FIG. 1b, a mirror segment arrangement 100 present in an optical arrangement according to the disclosure has a plurality of mirror segments (seven mirror segments in the concrete exemplary embodiment). The optical arrangement can be used in a microlithographic projection exposure apparatus (in particular in the projection lens of the projection exposure apparatus), as will be described in greater detail below with reference to FIG. 7.

In the concrete exemplary embodiment, the mirror segment arrangement 100 has six edge segments 101-106, wherein each edge segment has an edge region corresponding to an edge region of the entire mirror segment arrangement 100. Furthermore, in the example shown (without the disclosure being restricted thereto) a central segment 107 is present, which has no edge region corresponding to the edge region of the entire mirror segment arrangement 100. In principle, the disclosure is possible with a wide variety of further possible mirror segment arrangements (having a higher or lower number of mirror segments, with or without a central segment).

As can be seen from FIG. 1a for three of the mirror segments 101-107, the mirror segments 101-107 each have, on the opposite side to the optically active surface of the mirror segment arrangement 100, a tapering 101a, 102a, . . . (only illustrated for the mirror segments 101, 104 and 107 in FIG. 1b), respectively adjoined by a widened section 101b, 102b, . . . for the mounting and/or actuation of the mirror segment 101, 102, . . . . While the tapering 101a, 102a, . . . is in each case embodied in the form of a web, the respective widened section 101b, 102b, . . . in each case forms a tripod by which the mirror can be held or—in the case of an active or actuable mirror—can, if appropriate, also actively be brought into a desired position via actuators. In accordance with FIG. 1a a respective joint 110 is situated between the respective widened section 101b, 102b, . . . and the relevant tapering 101a, 102a, . . . at which joint (e.g. by adhesive bonding, soldering or some other suitable joining technique) the widened section 101b, 102b, . . . and the tapering 101a, 102a, . . . are joined to one another.

The geometrical dimensions of the tapering 101a, 102a, . . . are chosen such that a suitable compromise between the mechanical decoupling obtained, on the one hand, and a sufficient stiffness of the arrangement, on the other hand, is obtained. For this purpose, the web forming the tapering in the exemplary embodiment preferably has a length which corresponds at least to its maximum diameter and is, in particular, at least 1.2 times, more particularly 1.4 times, its maximum diameter.

Merely by way of example, the radial length of the lever provided by the widened section 101b, 102b, . . . or the tripod can be at least twice the maximum radius of the tapering 101a, 102a, . . . or of the web in order that a sufficient leverage can be obtained. Typical dimensions of the lever provided by the widened section 101b, 102b, . . . or the tripod can be, for instance, a few centimeters (cm); in the case of large mirrors, the lever length can preferably be more than 5 cm.

FIGS. 2a-b serve for elucidating a further exemplary embodiment of the optical arrangement in accordance with the first aspect of the present disclosure. In this case, comparable or substantially functionally identical components relative to FIG. 1 are designated by analogous reference numerals increased by "100".

The arrangement of FIGS. 2a-b differs from that from FIGS. 1a-b in that the respective widened section 201b, 202b, . . . configured as a tripod is embodied monolithically with the respectively assigned tapering 201a, 202a, . . . such that in this respect, in contrast to FIGS. 1a-b, there is no joint present at the transition between section 201b, 202b, . . . and tapering 201a, 202a, . . . .

In the case of this configuration, however, a joint present elsewhere, to be precise concretely in accordance with FIG. 2a the joint designated by the reference sign "250", is then important for the introduction of mechanical stresses or deformations into the respective mirror segment or the mirror arrangement, such that the advantages obtained in accordance with the first aspect of the present disclosure are manifested here in a manner analogous to the arrangement from FIGS. 1a-b.

Different embodiments in accordance with a further aspect of the present disclosure are explained below with reference to FIGS. 3-7.

FIG. 3a schematically illustrates a mirror segment arrangement 300 constructed of a first mirror segment 310 and a second mirror segment 320. Without the disclosure being restricted to this, the mirror segments 310, 320 in each case have a substantially semicircular geometry, in which case they complement one another in the mounted state to form a substantially circular geometry.

The first mirror segment 310 has, for a statically uniquely determined mounting, three mounting elements 311, 312 and 313 distributed along the circumference of the mirror segment 310, of which the mounting element 313 on the rear side or the opposite side to the optically active surface of the mirror segment arrangement extends into the region of the second mirror segment 320. For this purpose (without the disclosure being restricted thereto), the second mirror segment 320 can have a corresponding cutout for accommodating the corresponding mounting element 313. The relevant mounting element 313 is arranged without mechanical contact with the second mirror segment 320, such that deformations cannot be introduced into the second mirror segment 320 via the mounting element 313.

Conversely, in accordance with FIG. 3a, one of the three mounting elements 321, 322 and 323 of the second mirror segment 320, namely the mounting element 323, also extends into the region of the first mirror segment 310, this arrangement being effected in a manner analogous to the embodiment described above, such that, in particular, there is no mechanical contact between the mounting element 323 and the first mirror segment 310.

FIGS. 3b and 3c show further configurations with the realization of the principle described above with reference to FIG. 3a, wherein the mirror segment arrangement 325 composed of three mirror segments 330, 340 and 350, each embodied as edge segments is shown in accordance with FIG. 3b, and a mirror segment arrangement 355 composed of four mirror segments 360, 370, 380 and 390 each embodied as edge segments is shown in accordance with FIG. 3c.

FIGS. 4a and 4b show further embodiments with the realization of the principle already described with reference to FIG. 3, wherein here a respective mirror segment 445 and 495 arranged as a central segment is provided in addition to four mirror segments 410-440 and 460-490, respectively, embodied as edge segments. The embodiments in FIG. 4a and FIG. 4b differ in that, in accordance with FIG. 4b, the mirror segment 495 embodied as a central segment has corresponding cutouts or undercuts for mounting elements of the mirror segments 460-490 each embodied as an edge segment, the mounting elements each extending into the region of the mirror segment 495, whereas, in the mirror segment arrangement 400 in accordance with FIG. 4a, corresponding cutouts or undercuts are not arranged in the mirror segment 445 embodied as a central segment, but rather in the mirror segments 410-440 each embodied as an edge segment. What is common to the two embodiments in FIGS. 4a and 4b is that the mounting elements installed at the mirror segment 445 and 495, respectively, embodied as a central segment are all arranged below adjacent mirror segments.

FIGS. 5a-b show merely by way of example further embodiments with the realization of the concept described above with reference to FIG. 3 and FIG. 4.

In this case, in accordance with FIG. 5a, six mirror segments 510, 515, 520, 525, 530 and 535 arranged as edge segments are provided, wherein here each of the edge segments has in each case a linking or a mounting element arranged outside the region defined by the optically active surface of the mirror segment arrangement 500. By contrast, all of the remaining mounting elements are arranged in a manner analogous to FIG. 3a or FIG. 4b such that they extend into regions of respectively adjacent mirror segments.

FIG. 5b shows an arrangement largely analogous to FIG. 5a, wherein, however, all of the mirror segments 555, 560, 565, 570, 575 and 580 each embodied as an edge segment are realized without the positioning of mounting locations outside the region defined by the optically active surface of the mirror segment arrangement 550. Consequently, in accordance with FIG. 5b, all of the mounting elements are arranged in such a way that they each extend in a manner already described in the region of adjacent mirror segments.

FIGS. 6a-b show a further exemplary embodiment of a mirror segment arrangement 600 having six mirror segments 610-635 embodied as edge segments and a mirror segment 640 embodied as a central segment.

What is common to the embodiments in FIGS. 3 to 6 is that the mounting or linking for each of the mirror segments embodied as an edge segment is effected at least in a section lying below an adjacent mirror segment.

Figure 7:
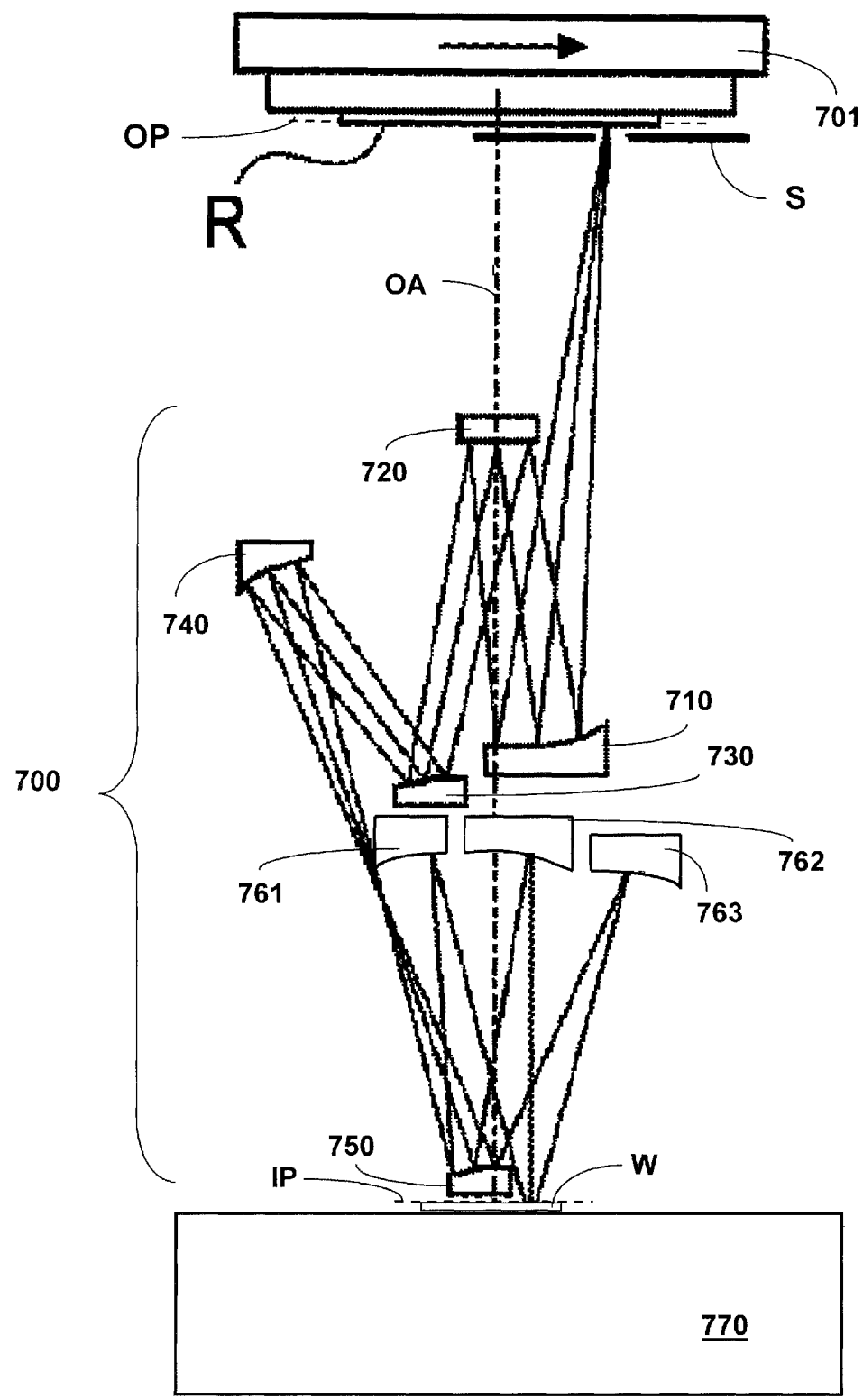
FIG. 7 shows a schematic illustration of the construction of a projection lens in which an optical arrangement according to the disclosure can be realized by way of example.

FIG. 7 shows a schematic illustration of the construction of a projection lens 700, in which one mirror is replaced by a mirror segment arrangement composed of separate mirror segments. The basic construction of the projection lens (without the segmentation) is known from U.S. Pat. No. 7,538,856 B2.

In the projection lens 700, EUV radiation from an illumination device (not illustrated) impinges on a mask (reticle) R having structures to be imaged through a slot S, which delimits that region of the mask R which is to be illuminated. The projection lens 700 has a plurality of mirrors (six mirrors in the exemplary embodiment) 710-760, wherein the last mirror 760 relative to the beam path on the image plane side is embodied, as illustrated only schematically in FIG. 1, as a mirror segment arrangement composed of separate mirror segments 761, 762 and 763.

The segmented embodiment of the last (and at the same time largest) mirror on the image plane side is particularly advantageous insofar as this mirror is particularly relevant to the image-side numerical aperture (NA). However, the disclosure is not restricted thereto, such that, instead of the last mirror on the image plane side, a different mirror of the projection lens 700 can also be configured as subdivided into separate segments in the manner described above. In further embodiments, it is also possible for a plurality of (i.e. two or more) mirrors to be subdivided into separate segments. It goes without saying that, furthermore, the number of three mirror segments chosen in accordance with FIG. 7 is merely by way of example, and a segmentation into more or fewer mirror segments can also be provided for example in accordance with the embodiments described above with reference to FIGS. 1-6.

Even though the disclosure has been described on the basis of specific embodiments, numerous variations and alternative embodiments are evident to the person skilled in the art, e.g. by combination and/or exchange of features of individual embodiments. Accordingly, it goes without saying for the person skilled in the art that such variations and alternative embodiments are concomitantly encompassed by the present disclosure, and the scope of the disclosure is restricted only within the meaning of the accompanying patent claims and the equivalents thereof.

The invention claimed is:

1. An optical arrangement, comprising:
   a mirror segment arrangement comprising a plurality of separate mirror segments including a first mirror segment and a second mirror segment adjacent the first mirror segment, the mirror segment arrangement having an optically active surface;
   a carrying structure; and
   mounting elements connecting the plurality of mirror segments to the carrying structure, the mounting elements including a first mounting element assigned to the first mirror segment,
   wherein:
      the first mounting element extends, on a side of the mirror segment arrangement which is opposite the optically surface of the mirror segment arrangement, at least partly into a region of the second mirror segment; and
      the optical arrangement is a microlithographic optical arrangement.

2. The optical arrangement of claim 1, wherein the first mounting element is arranged completely outside a region covered by the first mirror segment.

3. The optical arrangement of claim 1, wherein the second mirror segment has at least one cutout in which the first mounting element is at least partly accommodated.

4. The optical arrangement of claim 1, wherein the first mounting element is arranged without mechanically contacting the second mirror segment.

5. The optical arrangement of claim 1, wherein exactly three mounting elements are assigned to each mirror segment.

6. The optical arrangement of claim 1, wherein the first mirror segment is actuable along the first mounting element.

7. The optical arrangement of claim 1, wherein, for each of at least two of the plurality of mirror segments, at least one mounting element assigned to a respective mirror segment extends, on the side of the mirror segment arrangement which is opposite to the optically active surface of the mirror segment arrangement, at least partly into the region of another mirror segment of the mirror segment arrangement.

8. The optical arrangement of claim 1, wherein at least two mounting elements which are assigned to the same mirror segment extend, on the side of the mirror segment arrangement which is opposite to the optically active surface of the mirror segment arrangement, at least partly into a region of a respective mirror segment of the mirror segment arrangement adjacent to the first mirror segment.

9. The optical arrangement of claim 1, wherein three mounting elements which are assigned to the same mirror segment extend, on the side of the mirror segment arrangement which is opposite to the optically active surface of the mirror segment arrangement, at least partly into a region of a respective mirror segment of the mirror segment arrangement adjacent to the first mirror segment.

10. The optical arrangement of claim 1, wherein the plurality of mirror segment arrangement comprises at least three mirror segments.

11. The optical arrangement of claim 1, wherein the plurality of mirror segments define a continuous reflective surface.

12. The optical arrangement of claim 1, wherein the plurality of mirror segments define a reflective surface which is continuous but for interruptions defined by transition regions present between adjacent mirror segments.

13. The optical arrangement of claim 1, wherein at least two of the plurality of mirror segments are movable relative to each other.

14. An apparatus, comprising:
an illumination system; and
a projection lens,
wherein:
the illumination system comprises an optical arrangement according to claim 1 and/or the projection lens comprises an optical arrangement according to claim 1; and
the apparatus is an EUV microlithographic projection exposure apparatus.

15. An apparatus, comprising:
an illumination system; and
a projection lens,
wherein:
the illumination system comprises an optical arrangement according to claim 1; and
the apparatus is an EUV microlithographic projection exposure apparatus.

16. The apparatus of claim 15, wherein the projection lens comprises:
a mirror segment arrangement comprising a plurality of separate mirror segments including a first mirror segment, the mirror segment arrangement having an optically active surface;
a carrying structure; and
mounting elements connecting the plurality of mirror segments to the carrying structure,
wherein the first mirror segment has, on a side of the mirror segment arrangement which is opposite the optically active surface of the mirror segment arrangement, a tapering adjoined by a widened section to mount and/or actuate of the first mirror segment.

17. An optical arrangement, comprising:
a mirror segment arrangement comprising a plurality of separate mirror segments including a first mirror segment, the mirror segment arrangement having an optically active surface;
a carrying structure; and
mounting elements connecting the plurality of mirror segments to the carrying structure,
wherein:
the first mirror segment comprises, on a side of the mirror segment arrangement which is opposite the optically active surface of the mirror segment arrangement, first, second and third sections;
the second section connects the first and third sections;
the first section is wider than the second section;
the third section is wider than the second section;
the third section comprises first, second and third subsections;
the first, second and third subsections are connected to define a tripod; and
the optical arrangement is a microlithographic optical arrangement.

18. The optical arrangement of claim 17, wherein a length of the second section is at least as large as a maximum diameter of the second section.

19. The optical arrangement of claim 18, wherein the length of the second section is at least 1.2 times the maximum diameter of the second section.

20. The optical arrangement of claim 17, wherein the first, second and third sections are monolithic.

21. The optical arrangement of claim 17, wherein:
the first and second sub-sections define a first angle therebetween;
the second and third sub-sections define a second angle therebetween;
the first and third sub-sections define a third angle therebetween; and
the first angle equals the second angle.

22. The optical arrangement of claim 21, wherein the second angle equals the third angle.

23. The optical arrangement of claim 22, wherein the first angle equals the third angle.

* * * * *

UNITED STATES PATENT AND TRADEMARK OFFICE
CERTIFICATE OF CORRECTION

PATENT NO. : 9,250,417 B2  
APPLICATION NO. : 13/467760  
DATED : February 2, 2016  
INVENTOR(S) : Dirk Schaffer, Stefan Hembacher and Jens Kugler Page 1 of 1

It is certified that error appears in the above-identified patent and that said Letters Patent is hereby corrected as shown below:

In the specification,

Col. 1, line 10, after "also", insert -- claims --.

Signed and Sealed this
Twelfth Day of April, 2016

Michelle K. Lee
*Director of the United States Patent and Trademark Office*